(12) United States Patent
Schreck

(10) Patent No.: US 6,853,591 B2
(45) Date of Patent: Feb. 8, 2005

(54) CIRCUIT AND METHOD FOR DECREASING THE REQUIRED REFRESH RATE OF DRAM DEVICES

(75) Inventor: John Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/404,836

(22) Filed: Mar. 31, 2003

(65) Prior Publication Data

US 2004/0190349 A1 Sep. 30, 2004

(51) Int. Cl.⁷ .............................................. G11C 16/04
(52) U.S. Cl. .................. 365/189.07; 365/190; 365/210
(58) Field of Search ........................... 365/189.07, 190, 365/210, 204, 205

(56) References Cited

U.S. PATENT DOCUMENTS

| | | | |
|---|---|---|---|
| 5,148,546 A | 9/1992 | Blodgett | 395/750 |
| 5,781,483 A | 7/1998 | Shore | 365/200 |
| 5,870,348 A | 2/1999 | Tomishima et al. | 365/230.06 |
| 6,026,034 A * | 2/2000 | Suzuki et al. | 365/190 |
| 6,097,644 A | 8/2000 | Shirley | 365/200 |
| 6,188,637 B1 | 2/2001 | Ooishi | 365/233 |
| 6,269,039 B1 | 7/2001 | Glossner, III et al. | 365/210 |
| 6,301,191 B1 | 10/2001 | Ooishi | 365/233 |
| 6,337,824 B1 | 1/2002 | Kono et al. | 365/207 |
| 6,366,509 B2 | 4/2002 | Shirley | 365/200 |
| 6,384,623 B1 | 5/2002 | Sakata et al. | 326/34 |
| 6,421,281 B2 | 7/2002 | Suzuki | 365/189.09 |
| 6,487,136 B2 | 11/2002 | Hidaka | 365/222 |
| 6,512,714 B2 * | 1/2003 | Hanzawa et al. | 365/210 |
| 6,542,426 B2 | 4/2003 | Jung et al. | 365/222 |
| 6,545,925 B2 | 4/2003 | Lee | 365/222 |
| 6,545,931 B2 | 4/2003 | Hidaka | 365/227 |
| 6,552,955 B1 | 4/2003 | Miki | 365/233 |
| 6,567,332 B2 | 5/2003 | Sawhney | 365/222 |
| 6,603,698 B2 | 8/2003 | Janzen | 365/222 |
| 6,621,292 B2 | 9/2003 | Sakata et al. | 326/34 |
| 6,635,934 B2 | 10/2003 | Hidaka | 257/369 |
| 6,636,454 B2 | 10/2003 | Fujino et al. | 365/230.08 |
| 6,646,942 B2 | 11/2003 | Janzen | 365/222 |
| 6,665,222 B2 | 12/2003 | Wright et al. | 365/203 |
| 6,697,992 B2 | 2/2004 | Ito et al. | 714/763 |
| 6,711,093 B1 | 3/2004 | Shore et al. | 365/236 |
| 6,751,143 B2 | 6/2004 | Morgan et al. | 365/222 |
| 6,751,159 B2 | 6/2004 | Farrell et al. | 365/238.5 |

* cited by examiner

*Primary Examiner*—David Lam
(74) *Attorney, Agent, or Firm*—Dorsey & Whitney, LLP

(57) ABSTRACT

A method and circuit increases the capacitance of a digit line coupled to a memory cell capacitor during a memory read operation. The increased capacitance on the active digit line coupled to the memory cell capacitor causes it to respond slower to activation of a negative sense amplifier than a reference digit line that is also coupled to the sense amplifier. As a result, the sense amplifier favors sensing a high voltage from the memory cell thereby decreasing the required refresh rate of the memory cells because memory cell capacitors storing a high voltage tend to discharge faster than memory cell capacitors storing a low voltage.

32 Claims, 5 Drawing Sheets

CIRCUIT AND METHOD FOR DECREASING THE REQUIRED REFRESH RATE OF DRAM DEVICES

TECHNICAL FIELD

The present invention relates to memory devices, particularly dynamic random access memory devices, and, more particularly, to a method and apparatus for reducing the required refresh rate of dynamic random access memory ("DRAM") devices.

BACKGROUND OF THE INVENTION

A conventional memory device is illustrated in FIG. 1 and is described in U.S. Pat. Nos. 6,097,644 and 6,366,509, the disclosure of which is incorporated herein by reference. The memory device is a synchronous dynamic random access memory ("SDRAM") 10 that includes an address register 12 adapted to receive row addresses and column addresses through an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address. The row address multiplexer 18 also couples row addresses to the row address latches 26 for the purpose of refreshing the memory cells in the arrays 20 and 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers in associated column circuits 50 for the arrays 20 and 22.

Data to be read from one of the arrays 20 or 22 are coupled from the arrays 20 or 22, respectively, to a data bus 58 through the column circuit 50, and a read data path that includes a data output register 56. Data to be written to one of the arrays 20 or 22 are coupled from the data bus 58 through a write data path, including a data input register 60, to one of the column circuits 50 where they are transferred to one of the arrays 20 or 22, respectively. A mask register 64 may be used to selectively alter the flow of data into and out of the column circuits 50 by, for example, selectively masking data to be read from the arrays 20 and 22.

The above-described operation of the SDRAM 10 is controlled by a command decoder 68 responsive to high level command signals received on a control bus 70. These high level command signals, which are typically generated by the memory controller, are a clock enable signal CKE*, a clock signal CLK, a chip select signal CS*, a write enable signal WE*, a row address strobe signal RAS*, and a column address strobe signal CAS*, where the "*" designates the signal as active low. The command decoder 68 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

A portion of the column circuits 50 of FIG. 1 is shown in greater detail in FIG. 2. The column circuit 50 is shown connected to a pair of arrays 100, 102, which may be sub-arrays in either of the arrays 20, 22 shown in FIG. 1. Alternately, a single column circuit 50 containing the circuitry shown in FIG. 2 may be used to access both of the arrays 20, 22 shown in FIG. 1. The column circuit 50 includes a plurality of column node circuits 110a–n in addition to a redundant column node circuit 112. All of these column node circuits 110, 112 are identical, and, in the interest of clarity and brevity, the internal components of only one column node circuit 110a is shown in FIG. 2.

In FIG. 2, the column node circuit 110a interfaces with two columns of memory cells using two pairs of complementary digit lines D0, D0* and D1, D1*, respectively. However, it will be understood that the column node circuit 110a may contain fewer or greater numbers of complementary digit line pairs. In the interest of brevity, the digit lines D0, D0* and D1, D1* in the column node circuit 110 as well as in the other column node circuits 110b–n and 112 will sometimes be referred to as simply D and D*. Each digit line pair D, D* has coupled therebetween a negative sense amplifier 120, a positive sense amplifier 122, an equilibration circuit 124, and an I/O circuit 126.

The equilibration circuit 124 is controlled by a pre-charge control circuit 130 that may be part of the row decoder control 28 (FIG. 1) to couple the digit lines D, D* to each other and to an equilibration voltage DVC2, which typically has a magnitude equal to one-half the magnitude of a supply voltage VCC. A typical two transistor equilibration circuit includes a first n-channel transistor coupled between digit line D and equilibration voltage DVC2 and a second n-channel transistor coupled between digit line D* and equilibration voltage DVC2. The gate electrodes of both n-channel transistors are coupled to control signal EQ. When control signal EQ from pre-charge control circuit 130 pulses high (e.g., to VCC), the two n-channel transistors of equilibration circuit 124 turn on, and charge flows between digit lines D, D* and equilibration voltage DVC2. Equilibration voltage DVC2 supplies or removes charge from both digit lines until the voltage on both digit lines D and D* is equal to DVC2. Persons of ordinary skill in the art will appreciate that a variant of the two transistor equilibration circuit is three n-channel equilibration circuit where the third n-channel transistor is coupled between the two digit lines, and a gate electrode of the third transistor is coupled to control signal EQ. This third transistor assists in speeding the equilibration between the voltages on the two digit lines. All three n-channel transistors of equilibration circuit 124 turn on, and charge flows between digit lines D, D* and equilibration voltage DVC2. Here to, equilibration voltage DVC2 supplies or removes charge from both digit lines until the voltage on both digit lines D and D* is equal to DVC2. After equilibration, control signal EQ pulses low again (e.g., ground), and all three n-channel transistors of equilibration circuit 124 turn off.

FIG. 2 depicts a typical sense amplifier that includes the negative sense amplifier 120 and the positive sense amplifier 122. When both parts of the sense amplifier are enabled, the sense amplifier operates as a latch made up of two cross coupled CMOS inverters. Typically during equilibration the sense amplifier is deactivated so as to avoid sourcing or draining any current to or from the digit lines. When the EQ signal pulses high (e.g., to VCC), current flows between the digit lines and DVC2 until both the digit lines are precharged to DVC2.

FIG. 3 shows a portion of the memory arrays 100, 102 of FIG. 2. The array portion includes two pairs of complementary digit lines D, D*. Each of the digit lines D, D* is coupled through respective access transistor 160 to one plate of alternating storage capacitors 162. The other plate of each storage capacitor 162 is a "cell plate" that is typically coupled to a voltage DVC2 having a magnitude of one-half of the supply voltage (e.g., VCC/2). The access transistors 160 and storage capacitors 162 are arranged in rows and columns. The access transistors 160 in each column are coupled to a respective pair of digit lines D, D*, and the gate electrodes of the access transistors 160 in each row are connected to a respective word line ROW 1, ROW 2 . . . ROW N. In operation, the storage capacitors 162 store voltages indicative of either a logic "0" or a logic "1". After the digit lines D, D* have been equilibrated by the equilibration circuit 124 (FIG. 2), an imbalance of the voltage on the digit lines is created by turning on the access transistors 160 in an addressed row of memory cells to couple the storage capacitors (162, FIG. 3) in that row onto one, but not both, digit lines for each column. The digit line coupled to a storage capacitor 162 in each column is called the active digit line, and the other digit line is called the reference digit line. If the storage capacitor 162 coupled to the digit line D were charged to a voltage greater than DVC2 (i.e., a 1's condition), the charge on the storage capacitor 162 will increase the voltage on the active digit line to be greater than the voltage on the reference digit line. Conversely, if the storage capacitor 162 coupled to the digit line D were charged to a voltage less than DVC2 (i.e., a 0's condition), the lack of charge on the storage capacitor will decrease the voltage on the active digit line to be less than the voltage on the reference digit line. The charge stored on the capacitors 162 coupled to the complementary digit line D* is the opposite of that explained above. Specifically, a "1" stored on the storage capacitor 162 coupled to a complementary digit line D* is discharged to zero volts, and a "0" stored on the storage capacitor 162 coupled to a complementary digit line D* is charged to VCC.

After the charge on the storage capacitor 162 has been coupled to the active digit line, the sense amplifier is turned on. An imbalance in the digit lines is enhanced by the sense amplifier, and the latch effect of the sense amplifier is enabled so as to drive the digit lines D, D* in the direction of the imbalance until one of the digit lines is at the supply voltage and the other of the digit lines is at ground potential. In this way, the sense amplifiers 120, 122 detect a voltage imbalance in the digit lines D, D* during a read access of memory cells in the arrays 100, 102. The access transistors 160 coupled to an active row line remain ON during the time the sense amplifiers 120, 122 drive to digit lines to the supply voltage and ground potential. As a result, the storage capacitors 162 in the active row are recharged or to their original value or "refreshed" in they event they were internally discharged by leakage currents.

Once the sense amplifiers 120, 122 have driven the digit lines D, D* to voltages indicative of the data read from a memory cell in the respective column, the digit lines D0, D0* are coupled to respective I/O lines I/OA, I/OA* by the I/O circuit 126 (see FIG. 2). As is a well understood in the art, in a read memory access, the signals from the digit lines are coupled to a DC sense amplifier, which applies a corresponding data signal to the data bus of the memory device. The other digit lines D1, D1* in the column node circuit 110a are similarly coupled to a respective pair of I/O lines I/OB, I/OB* by a respective I/O circuit 126.

In a write memory access, the I/O lines are driven by respective write drivers (not shown), and are coupled to the digit lines D, D* by the I/O circuit 126.

The column node circuit 110a receives a SEL_R signal from a respective inverter 114 to cause it to couple its digit lines D, D* to the I/O lines I/O, I/O*, respectively. Similarly, the column node circuit 110b receives a SEL_R+1 signal to couple its digit lines to the same I/O lines, and the column node circuit 110n receives a SEL_R+N signal to couple its digit lines to the same I/O lines. Since the SEL signals select various columns of memory cells in the arrays 100, 102, they are normally generated by the column decoder 48 (FIG. 1).

The I/O circuits 126 in the redundant column node circuit 112 are likewise coupled to the same I/0 lines by a select SEL_RED signal, but the SEL_RED signal is generated by a redundant column control circuit 144. The redundant column control circuit 144 may be part of the column decoder 48 (FIG. 1).

As mentioned above, the column node circuits 110a–n and 112 are coupled to both arrays 100, 102. However, the column node circuits cannot receive signals indicative of read data from both arrays 100, 102 at the same time. For this reason, isolation transistors 150, 152 are often coupled between each digit line D, D* of the column node circuit and corresponding digit lines D, D*, respectively, of the arrays 100, 102. All of the isolation transistors 150 coupled to the array 100 are turned ON by a common ISO_LEFT signal, and all of the isolation transistors 152 coupled to the array 102 are turned ON by a common ISO_RIGHT signal. Since the arrays 100, 102 contain rows of memory cells corresponding to different row addresses, the ISO_LEFT and ISO-RIGHT signals are typically generated by the row decoder control 28 (FIG. 1).

Although the manufacturing yield of memory devices is very good, the large number of transistors, signal paths, and other components, such as capacitors, contained in memory devices creates a significant statistical probability that a memory device will contain at least one defective transistor, signal path or other component. For this reason, memory devices typically incorporate rows and columns of redundant memory cells. If a row or column of memory cells is found to be defective during testing, either before or after packaging the memory device, the memory device can be programmed to substitute a redundant row of memory cells for the defective row, or a redundant column of memory cells for the defective column. The redundant column node circuit 112 is provided to interface with redundant columns of memory cells in the arrays 100, 102. The redundant column node circuit 112 interfaces with two columns of memory cells, so that two redundant columns are substituted whenever a single defective column is found during testing. However, it will be understood that redundant columns can be substituted on a column-by-column basis, or that redundant columns can be substituted in groups larger than two. The number of digit lines D, D* in the redundant column node circuit 112 can be adjusted as desired to match the number of redundant columns that are substituted.

Such memory devices include one or more arrays of memory cells arranged in rows and columns. Each array may be divided into several sub-arrays. Typically, one or more digit or "bit" line is provided for each column of the array, and each digit line is coupled to a respective sense amplifier. Each sense amplifier is generally a differential amplifier that compares the voltage at one of its inputs to the voltage at the other of its inputs. The sense amplifier then drives its inputs to complementary logic levels corresponding to the sensed differential voltage.

There are currently two principal array architectures that are commonly used in memory devices, such as DRAMs: a folded digit line architecture and an "open-array" architecture. In an "open-array" architecture, the complementary digit lines span two adjacent sub-arrays, and each digit line is coupled to each memory cell in a respective column. A sense amplifier is coupled to the digit lines of two adjacent sub-arrays. Thus, each sense amplifier is shared by two sub-arrays so that one input to the sense amplifier is coupled to the digit line of one array and the other input to the sense amplifier is coupled to the digit line of the other array. Prior to a memory read operation, the digit lines are pre-charged to a voltage that is typically one-half the supply voltage, a voltage known as DVC2.

In response to a memory read operation, one of the digit lines coupled to a sense amplifier is coupled to a memory cell being read. In response, the voltage on the digit line either increases or decreases from DVC2 depending upon the logic level stored in the memory cell. The other digit line remains at the pre-charge voltage, DVC2. The sense amplifier detects that the voltage on the digit line coupled to the memory cell being read has either increased or decreased relative to the pre-charge voltage and then drives the digit lines to complementary logic levels corresponding to the sensed voltage.

The other architecture that is commonly used in memory device arrays is the folded digit line architecture, which is shown in FIG. 2 and was previously explained. In a folded digit line architecture, each column is provided with a pair of complementary digit lines, and the digit lines of each pair are generally coupled to alternate memory cells in the same sub-array. The complementary digit lines are coupled to the inputs of a respective sense amplifier. Thus, the digit lines coupled to each sense amplifier are from the same sub-array. A memory read operation in a folded digit line architecture was previously explained with reference to FIG. 2, and is essentially the same as in an open-array architecture.

Each of the above-described architectures has its advantages and disadvantages. A disadvantage of the open-array architecture relative to the folded digit line architecture is that it is susceptible to errors resulting from noise because each sense amplifier input is coupled to a different array. In contrast, since both digit lines coupled to a sense amplifier in a folded digit line architecture extend closely adjacent each other through the same array, they tend to pick up the same noise signals. The differential operation of the sense amplifiers thus makes them insensitive to these common mode noise signals.

Although folded digit line architectures have better noise immunity, they have a significant disadvantage compared to open-array architectures in that they are less efficient. Due to the nature of the layout of a folded architecture, each memory cell occupies 8F2 in area, where "F" is the minimum feature size of the semiconductor process. The layout of an open array architecture allows for a 6F2 cell area, thereby resulting in a 25% reduction over the 6F2 cell. Thus, open-array architectures are theoretically substantially more efficient than folded digit line architectures in using the surface area of a semiconductor die.

The drain and source of each access transistor 160 are typically formed by N type implant regions in a P type substrate, and the substrate generally is coupled to a potential of 0 volts (i.e., ground) or most times a negative voltage. The N type implant region of transistor 160 that is coupled to capacitor 162 forms a diode junction with the P type substrate.

When a logic "0" is stored on capacitor 162, the N type implant region of transistor 160 that is coupled to capacitor 162 will be charged to a potential of 0 volts (i.e., ground), and the voltage difference across the diode junction is zero volts, assuming the P type substrate is also coupled to a potential of 0 volts (i.e., ground). However, when a logic "1" is stored on capacitor 162, the N type implant region of transistor 160 that is coupled to capacitor 162 will be charged to a potential of +VCC volts (i.e., the supply voltage), and the voltage difference across the diode junction is therefore VCC volts. Although the diode junction is back biased it nevertheless passes a small amount of leakage current. Eventually, charge leakage from a storage capacitor 162 will cause the potential on the capacitor to decay until, what was once a logic "1", will appear as a logic "0". Before this point in time, the charge on the capacitor is refreshed during normal operation. As previously explained, a refresh cycle involves activating a word line to couple the voltage on the capacitor to a sense amplifier (before the capacitor's potential decays sufficiently to loose data). Each sense amplifier then drives the respective pair of digit lines D, D*, and a digit line is driven to VCC for a cell that is to store a logic "1" to recharge the storage capacitor 162 in the active row. Each refresh cycle consumes a discrete quantity of energy. Since the refresh cycles are repeated sufficiently often to avoid data loss, the loss of the discrete quantity of energy also repeats at the same rate. This translates into power consumed by the memory device.

The power consumed by integrated circuits can be a critical factor in their utility in certain applications. For example, the power consumed by memory devices used in portable personal computers greatly affects the length of time they can be used without the need to recharge batteries powering such computers. Power consumption can also be important even where memory devices are not powered by batteries because it may be necessary to limit the heat generated by the memory devices.

In general, memory device power consumption increases with both the capacity and the operating speed of the memory devices. The power consumed by memory devices is also affected by their operating mode. A dynamic random access memory ("DRAM"), for example, will generally consume a relatively large amount of power when the memory cells of the DRAM are being refreshed because rows of memory cells in a memory cell array are then being actuated in the rapid sequence. Each time a row of memory cells is actuated, a pair of digit lines for each memory cell are switched to complementary voltages and then equilibrated, thereby consuming a significant amount power. As the number of columns in the array increases with increasing memory capacity, the power consumed in actuating each row increases accordingly. Power consumption also increases with increases in the rate at which the rows of memory cells are actuated. Thus, as the speed and capacity of DRAMs continue to increase, so also does the power consumed increase during refresh of memory cells in such DRAMs.

As the use of electronic devices, such as personal computers, continue to increase, it is becoming ever more important to make such devices portable. The usefulness of portable electronic devices, such as notebook computers, is the limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices, such a notebook computers, typically include dynamic random access memory ("DRAM") devices that consume a substantial amount of power. As the data storage capacity and operating speeds of DRAM devices continues to increase, the power consumed by such devices has continued to increase in a corresponding manner.

One technique that has been used to reduce the amount of power consumed by refreshing DRAM memory cells is to vary the refresh rate as a function of temperature. As is well known in the art, the rate at which charge leaks from a DRAM memory cell increases with temperature. The refresh rate must be sufficiently high to ensure that no data is lost at the highest temperature in the specified range of operating temperatures of the DRAM device. Yet, DRAM devices normally operate at a temperature that is substantially lower than their maximum operating temperature. Therefore, DRAM devices are generally refreshed at a rate that is higher than the rate actually needed to prevent data from being lost, and, as a result, unnecessarily consume power. To address this problem, some commercially available DRAM devices allow the user to program a mode register to select a lower maximum operating temperature. The DRAM device then adjusts the refresh rate to correspond to the maximum operating temperature selected by the user.

Although adjusting the refresh rate as a function of temperature does reduce the rate of power consumed by refresh, it nevertheless still allows power to be consumed at a significant rate for several reasons. For example, although the refresh rate may be reduced with reduced maximum operating temperature, the refresh may still result in refreshing a large number of memory cells that are not actually storing data.

Another approach to reducing the rate at which power is consumed by a refresh operation is to refresh less than all of the memory cells in the DRAM device in attempt to refresh only those memory cells needed to store data for a given application. As described in U.S. Pat. No. 5,148,546 to Blodgett, incorporated herein by reference, a software program being executed in a computer system containing the DRAM devices is analyzed to determine the data storage requirements for the program. The DRAM device is then refreshed only those rows of memory cells that are needed to store data.

In another approach, the DRAM device may be operated in a partial array self refresh ("PASR") mode. In the PASR mode, a mode register is programmed by a user to specify a bank or portion thereof of memory cells that will be used and thus must be refreshed. The remaining memory cells are not used and thus need not be refreshed during at least some refresh modes. Although these techniques for refreshing less than all of the memory cells in a memory device can substantially reduce the rate of power consumption, it can nevertheless require a substantial amount of power to refresh the cells that are to be refreshed.

Still another technique that can be used to reduce the rate of refresh involves operating DRAM devices in a half density mode. A DRAM device that may be operated in a half density mode is described in U.S. Pat. No. 5,781,483 to Shore, incorporated herein by reference. In the half density mode, the low order bit of each row address, which normally designates whether the addressed row is even or odd, is ignored, and both the odd row and adjacent even row are addressed for each memory access. In a folded digit line architecture, activating an odd row will couple each memory cell in the row to a respective digit line, and activating an even row will couple each memory cell in the row to a respective complementary digit line. Thus, for example, writing a "1" to an addressed row and column would result in writing a logic "1" voltage level to the memory cell in the addressed odd row and writing a logic "0" logic level to the memory cell in the addressed even row. Reading from the addressed row and column results in a logic "1" voltage level being applied to the digit line for the addressed column and a logic "0" voltage level being applied to the complementary digit line for the addressed column. Therefore, in the half density mode, a sense amplifier coupled to the digit line and complementary digit line for each column receives twice the differential voltage that it normally receives when reading a memory cell at an addressed row and column.

The half density mode can be used to reduce that rate at which power is consumed during refresh. Although a refresh in the half density mode requires twice as many memory cells to be refreshed for a given amount of stored data, the required refresh rate is less than half the required refresh rate when the DRAM device is operating in the full density mode. The substantially lower refresh rate required in the half density results from the increased differential voltage that is applied to the sense amplifiers in the half density mode, as previously explained. As a result, the memory cells can be allowed to discharge to a greater degree between refreshes without the data bits stored therein being lost. Therefore, storing data in the half density mode can reduce the rate of power consumption during refresh.

Although these problems have been explained with reference to the SDRAM 10 shown in FIG. 1, it will be understood that the same problems exist with other dynamic random access memories ("DRAMs") including asynchronous DRAMs and packetized DRAMs, such as synchronous link DRAMs ("SLDRAMs") and RAMBUS DRAMs ("RDRAMs").

All of the above techniques are at least somewhat effective in reducing the required refresh rate of DRAMs. However, they do not provide optimum results because, whatever technique is used, it is still necessary to refresh the storage capacitors before the charge on the capacitors has changed to the point where data read errors might occur. If some means could be devised to increase the time that could lapse before it was necessary to recharge the storage capacitors, the power saved by virtually all of the above-described techniques could be further increased. There is therefore a need for a method and apparatus that can be used to extend the time between refresh cycles without loss of data which does not unduly increase the cost or power consumption of memory devices.

SUMMARY OF THE INVENTION

A method and circuit according to the present invention increases the capacitance on an active digit line relative to a capacitance on a reference digit line during a memory read operation. As a result, if a storage capacitor coupled to active digit line is charged to a voltage such as VCC, the voltage of the reference digit line will transition toward ground potential more rapidly than the transition of the voltage of the active digit line. Therefore, if leakage current has significantly discharged the storage cell capacitor, the sense amplifier will still be able to sense the high voltage on the capacitor because the voltage of the reference digit line can quickly transition to ground. As a result, the sense amplifier "favors" sensing a high voltage from the storage capacitor. While favoring the capacitor charged to a voltage such as VCC disfavors capacitors discharged to ground potential, this does not prevent an accurate sensing of the voltage on these capacitors because there is relatively little leakage current from capacitors storing ground potential. By favoring the sensing of a high voltage from storage capacitors, the storage capacitors can be allowed to discharge to a greater extent without causing memory read errors. This greater amount of allowable storage capacitor discharge results in an increase in the rate at which the storage must be refreshed to avoid data read errors.

BRIEF DESCRIPTION OF THE DRAWINGS

The various embodiments of the invention will be described in detail in the following description of preferred embodiments with reference to the following Figures wherein.

DETAILED DESCRIPTION OF THE INVENTION

Figure 4:
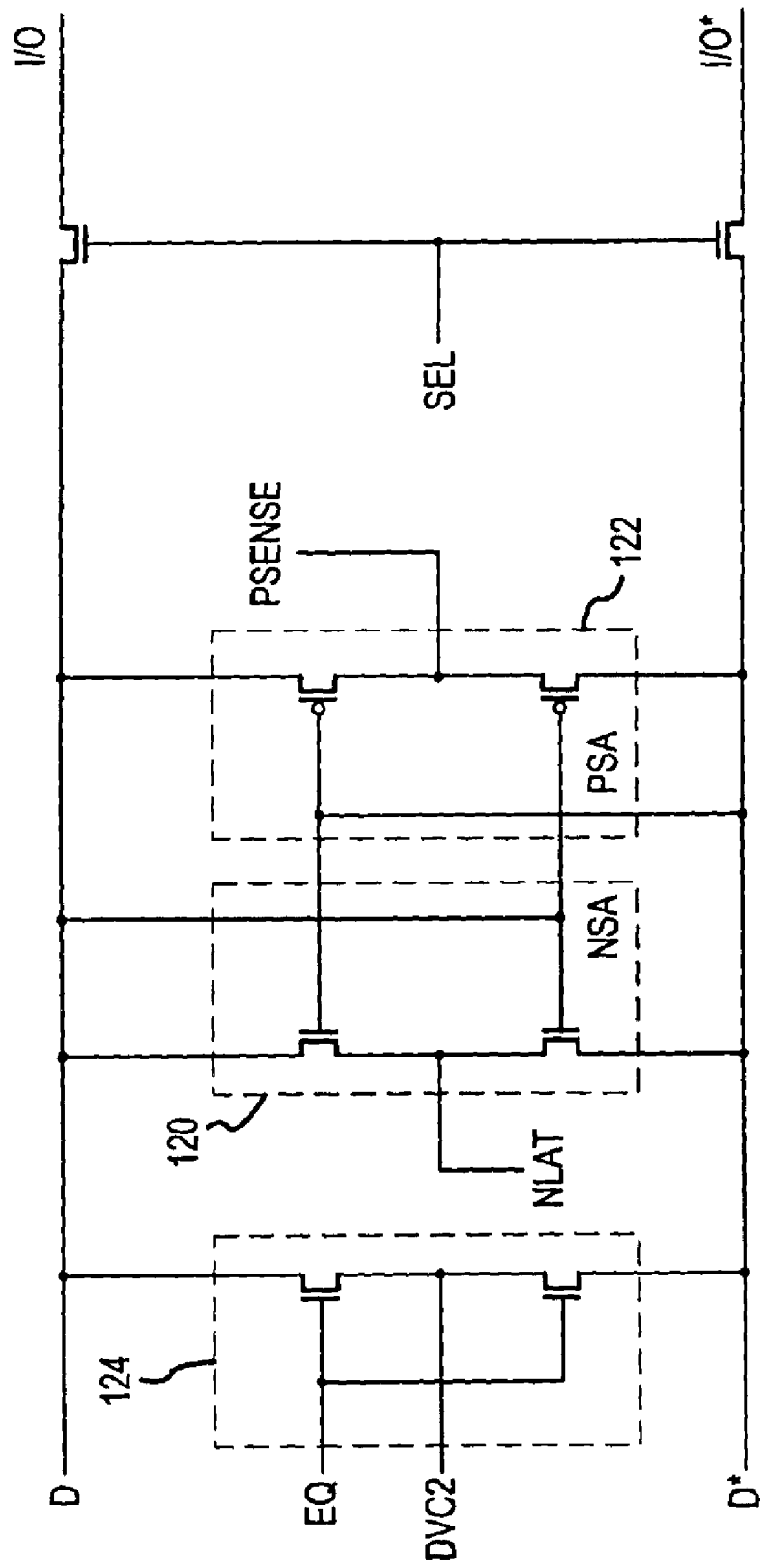
FIG. 4 is a schematic diagram of a equalization circuit and sense amplifier used with one embodiment of the present invention.

FIG. 4 depicts a typical sense amplifier that includes the negative sense amplifier 120 and the positive sense amplifier 122. The negative sense amplifier 120 is connected to a switched negative latch signal NLAT that is selectively coupled to ground. The positive sense amplifier 122 is connected to a switched positive sense amplifier signal PSENSE that is selectively coupled to either the supply voltage VCC. Inspection of the sense amplifier depicted in FIG. 4 reveals that with NLAT coupled to ground and PSENSE coupled to VCC, the sense amplifier operates as a latch made up of two cross coupled CMOS inverters.

Typically during equilibration, NLAT is driven to DVC2 and PSENSE is driven to ground so as to avoid sourcing or draining any current to or from a digit line. When the EQ signal pulses high (e.g., to VCC), current flows between the digit lines and DVC2 until both the digit lines are precharged to DVC2.

Figure 3:
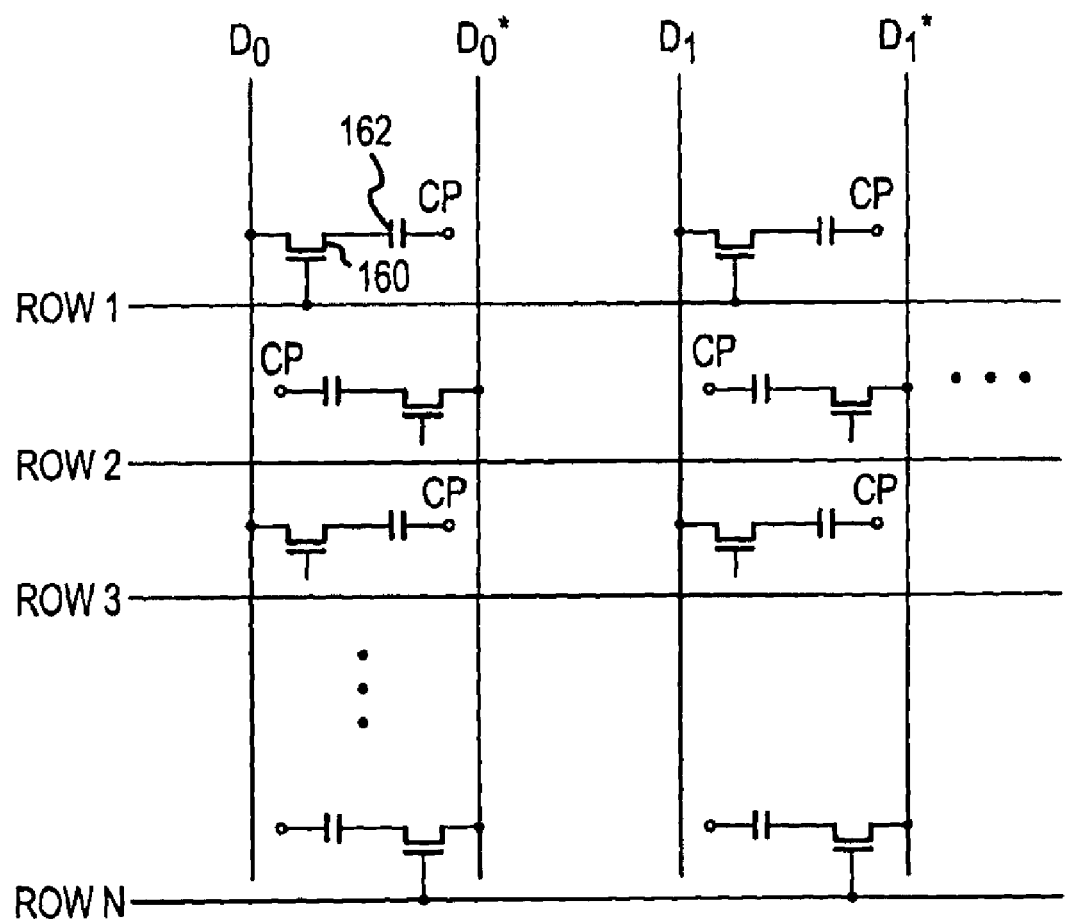
FIG. 3 is a schematic diagram illustrating a portion of the memory arrays used in the SDRAM of FIG. 1, which interface with the circuitry depicted in FIG. 2.

After the digit lines D, D* have been equilibrated by the equalization circuit 124, an imbalance of the voltage on the digit lines is created by turning on an access transistor (160, FIG. 3) in an addressed memory cell to couple the storage capacitor (162, FIG. 3) of that memory cell onto one, but not both, digit lines. The digit line so coupled is called the active digit line, and the other digit line is called the reference digit line. If the storage capacitor coupled to the digit line D were charged to a voltage greater than DVC2 (i.e., a 1's condition), when the access transistor 160 is turned on, the voltage on the active digit line will increase to be greater than the voltage on the reference digit line. Conversely, if the storage capacitor coupled to the digit line D were charged to a voltage less than DVC2 (i.e., a 0's condition), when the access transistor 160 is turned on, the voltage on the active digit line will decrease to be less than the voltage on the reference digit line. In either case, a voltage imbalance is created between the active and reference digit lines.

After the charge on the addressed storage capacitor has been coupled to the active digit line, the sense amplifier is turned on. First, NLAT is coupled to a ground potential to enable the operation of the n-channel transistors of the negative sense amplifier 120, then a short time later, PSENSE is coupled to a positive potential (e.g., VCC) to enable the p-channel transistors of the positive sense amplifier 122. When the n-channel transistors of the negative sense amplifier 120 are activated before the p-channel transistors of the positive sense amplifier 122, the reference digit line pulls down faster than the active digit for reasons that will be explained below. Under these circumstances, the sense amplifier is skewed toward the logic "1" level. However, if the p-channel transistors of the positive sense amplifier 122 are activated before the n-channel transistors of the negative sense amplifier 120, then the active digit would be skewed toward the logic "0" level for reasons that will also be explained below.

When NLAT is initially coupled to ground, an imbalance in the digit lines is enhanced by turning on the n-channel transistor that has a gate electrode coupled to the most positive digit line to a lower resistance than a resistance of the other n-channel transistor. By turning on this transistor, the resistance through the transistor is reduced to help pull down to zero the more negative digit line. The other, more positive digit line, remains at a relatively higher potential.

Then, when PSENSE is coupled to a positive potential (e.g., VCC), the latch effect of the sense amplifier is enabled so as to drive the digit lines D, D* in the direction of the imbalance until one of the digit lines is at the supply voltage and the other of the digit lines is at ground potential. In this way, the sense amplifiers 120, 122 detects a voltage imbalance in the digit lines D, D* during a read access of memory cells in the arrays 100, 102. Although other sense amplifier designs might be used, any sense amplifiers 120, 122 generally drive the digit lines D, D* in the direction of the imbalance until one of the digit lines is at the supply voltage and the other of the digit lines is at ground potential.

Figure 2:
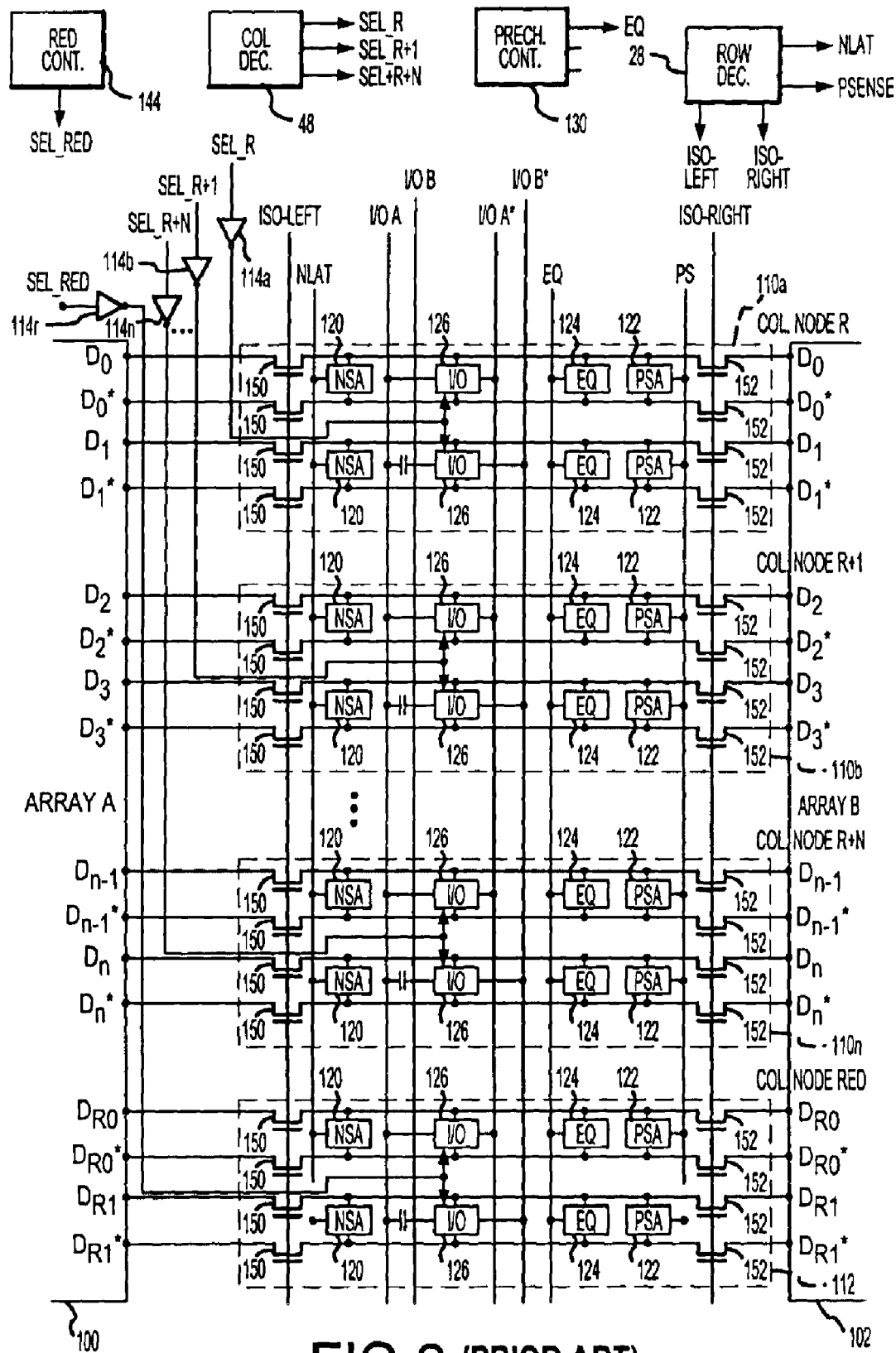
FIG. 2 is a block diagram and schematic diagram of a portion of a column circuit used in the SDRAM of FIG. 1.
Figure 5:
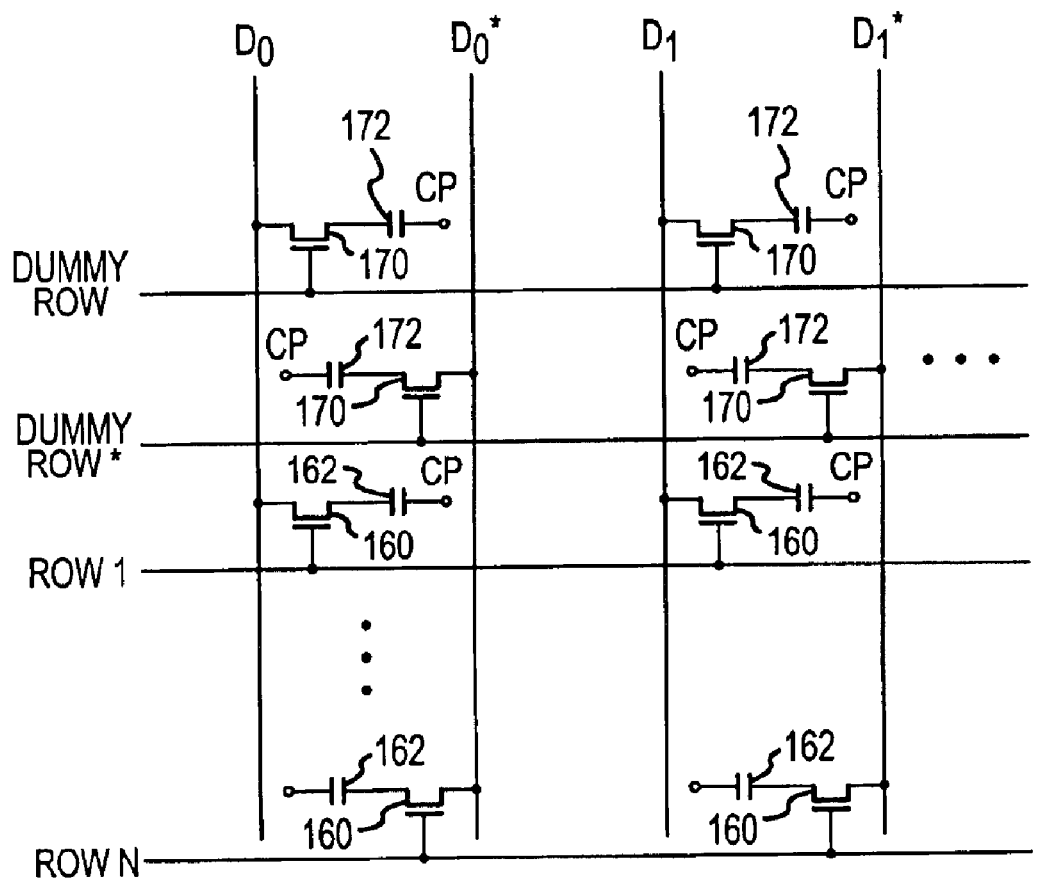
FIG. 5 is a schematic diagram illustrating a portion of the memory arrays used in memory arrays of a memory device according to one embodiment of the present invention.

With reference to FIG. 5, a portion of the memory arrays 100, 102 (FIG. 2) includes memory cells arranged in rows and columns between digit lines D and D*. One memory cell is provided for each column and each row in each memory array. In addition, one embodiment of the present inventive arrangement includes two additional rows, called Dummy Row and Dummy Row*. For each of these additional rows, the portion of the memory arrays 100, 102 also includes a memory cell disposed between digit lines D and D* for each column.

In the Dummy Row, each dummy memory cell includes one dummy access transistor 170, one dummy capacitor 172, a portion of a row line denoted DUMMY ROW, and a portion of digit line D. Dummy access transistor 170 selectively couples digit line D to one plate of the corresponding dummy storage capacitor 172. The other plate of the storage capacitor is a "cell plate" that is typically coupled to a voltage DVC2 having a magnitude of one-half of the supply voltage (e.g., VCC/2). Similarly, in the Dummy Row*, each dummy memory cell includes one dummy access transistor 170, one dummy storage capacitor 172, a portion of a row line denoted DUMMY ROW*, and a portion of digit line D*. Dummy access transistor 170 selectively couples digit line D* to one plate of the corresponding dummy storage capacitor 172.

In operation, the storage capacitors 162 of the regular memory cells store voltages indicative of either a logic "0" or a logic "1". For example, in a case where the supply voltage is +VCC volts, a logic "0" would be represented by 0 volts (i.e., ground) at one plate of the storage capacitor. The storage capacitor would then be charged to −VCC/2 volts relative to the "cell plate" since the "cell plate" of a storage capacitor is typically coupled to voltage DVC2 at +VCC/2 volts. A logic "1" would be represented by a voltage of VCC at one plate of the storage capacitor. The storage capacitor would then be charged to +VCC/2 volts relative to the "cell plate" since the "cell plate" of the storage capacitor is coupled to voltage DVC2 at +VCC/2 volts.

However, in contrast the memory cells in the Dummy Row and the Dummy Row* are not used to store data. Instead, the capacitors in the Dummy Row and the Dummy Row* are used to increase the capacitance on the digit line D, D* to which they are selectively coupled. More specifically, the memory cells in either the Dummy Row or the Dummy Row* are coupled to the active digit line for the respective columns to cause the sense amplifiers to favor sensing the voltage VCC, as previously mentioned, to enable the required refresh rate to be reduced.

As discussed above with respect to the regular data storage rows, the leakage current from storage capacitors charged to ground potential is significantly less than the leakage current from storage capacitors charged to VCC. As previously mentioned, charge leakage from a storage capacitor can cause the voltage on the capacitor to change until, what was once a logic "1", will appear as a logic "0" (e.g., as when VCC is used to encode a logic "1" and ground is used to encode a logic "0"). Before the voltage on the capacitor changes to this extent, the charge on the capacitor is refreshed. As also previously discussed, the leakage current from storage capacitors charged to ground potential is significantly less than the leakage current from storage capacitors charged to VCC. Therefore, if memory read errors occur because the capacitors are not being refreshed at a sufficient rate, the memory read errors will be from storage capacitors storing VCC rather than from storage capacitors storing ground potential. The ability to sense the voltage on capacitors storing VCC, know as the "1's margin" is therefore the limiting factor in the amount of time that can lapse between refreshing memory cells. By increasing the 1's margin, the refresh rate can be reduced, thereby reducing the amount of power consumed by DRAM devices.

For example, compare a first capacitor initially storing VCC (i.e., +VCC/2 volts relative to the voltage on the "cell plate" since the "cell plate" of the storage capacitor is coupled to voltage DVC2 at +VCC/2 volts) with a second capacitor initially storing zero volts or ground (i.e., −VCC/2 volts relative to the voltage on the "cell plate" since the "cell plate" of the storage capacitor is coupled to voltage DVC2 at +VCC/2 volts). After a sufficient time, leakage from the first capacitor will reduce the voltage on the first storage capacitor to, for example 60% of VCC (i.e., +VCC/10 volts relative to the voltage on the "cell plate" since the "cell plate" of the storage capacitor is coupled to voltage DVC2 at +VCC/2 volts). The +VCC/10 volts is the "1's margin."

However, since the voltage on the second capacitor is initially zero volts, and since its leakage is much reduced compared to the leakage of the first capacitor, the later voltage on the second capacitor remains substantially at zero volts (i.e., −VCC/2 volts relative to the voltage on the "cell plate since the "cell plate" of the storage capacitor is coupled to voltage DVC2 at +VCC/2 volts). The −VCC/2 volts is the "0's margin." Thus, as a time between refresh cycles extends, the 0's margin remains substantially unchanged while the 1's margin decreases until refresh is needed to avoid data loss.

In accordance with one example of the invention, one of the dummy capacitors is coupled to the active digit line (i.e., the digit line that is coupled to a storage capacitor) during each memory read operation to increase the capacitance of the active digit line. By coupling NLAT to ground prior to coupling PSENSE to VCC, the N sense amplifier 120 (i.e., the n-channel transistors of negative sense amplifier 120) drives both digit lines D, D* toward the ground potential. However, since the capacitance of the active digit line is now greater than the capacitance of the reference digit line, the voltage on the reference digit line decreases toward the NLAT voltage faster than the voltage on the active digit line. When the P sense amplifier 122 (i.e., the p-channel transistors of positive sense amplifier 122) is subsequently activated, it is then more easily able to drive the active digit line to VCC. More particularly, each digit line, D and D*, has a capacitance associated with the digit line, and there is a resistance associated with the n-channel transistors of the N sense amplifier 120. The capacitance of the digit line (together with any capacitors coupled to the digit line) and resistance of the transistor define a rate at which the voltage on the digit line will decline toward NLAT (e.g., ground) based on an exponential curve defined by the RC time constant. The voltage on the reference digit line is at the potential of DVC2 (i.e., VCC/2 volts) immediately before NLAT is coupled to ground, and this voltage will tend to decline toward ground faster than the voltage on the active digit line because the reference digit line has a lesser capacitance than the active digit line. Coupling a data storage capacitor 162 (having initially stored a voltage of VCC) to the active digit line increases the potential on the active data line above the potential of DVC2. However, coupling the data storage capacitor 162 to the active digit line after much of its charge has leaked off, will only increase the potential of the active digit line slightly above the potential of DVC2. Even though coupling of the dummy capacitor 172 (after having been equilibrated to the potential of DVC2 ) to the active digit line reduces the potential of the active digit line, somewhat, toward the potential of DVC2, this slight voltage reduction is small and leaves the potential on the active digit line substantially equal to or somewhat greater than the potential of DVC2. However, at the same time, the dummy capacitor 172 coupled to the active digit line adds a significant amount capacitance to the active digit line, so much that the potential on the active digit line declines toward the NLAT voltage much more slowly than does the decline of the potential on the reference digit line. This tends to increase the potential difference between the active and reference digit lines immediately after NLAT is coupled to ground. When PSENSE is then coupled to VCC, the potential difference between the potentials on the active and reference digit lines (as applied to the gate electrodes of the P sense amplifier 122) causes p-channel transistors of the P sense amplifier 122 to exhibit different resistances between drain and source. These different resistances between the p-channel transistors further drive the digit lines D and D* until they reach two different predetermined voltages (e.g., VCC and ground). Therefore, the sense amplifiers 120, 122 favor sensing a voltage of VCC from the storage capacitor when a dummy capacitor 172 has been coupled to one digit line. While increasing the capacitance of the active digit line also favors sensing a voltage of VCC on a capacitor storing ground potential, doing so does not cause a data read error since, as previously explained, the charge of storage capacitors storing ground potential does not change significantly between refreshes.

With further reference to FIG. 5, if a storage capacitor 162 is coupled to the digit line D, then D is referred to as the active digit line, and the Dummy Row line will be activated to couple the dummy capacitor 172 to the active digit line D. If a storage capacitor 162 is coupled to the complementary digit line D*, then the complementary digit line D* is referred to as the active digit line, and the Dummy Row* line will be activated to couple the dummy capacitor 172 to the complementary digit line D*. At least for this reason (the need for the dummy capacitor 172 to be coupled to the same digit line as the data storage capacitor 162 whether this be digit line D or digit line D*), dummy capacitors must be provided for each digit line in a complementary pair. However, dummy capacitors are preferably provided for both digit lines for still another reason. If only the digit line D was coupled to a dummy capacitor 172, then the imbalance in the capacitances of, and therefore the charge stored on, the digit lines D, D* would adversely affect the equilibration of the array. More specifically, one digit line is normally at VCC and the other digit line is normally at ground prior to equilibration. If the capacitances of, and therefore the charge stored on, the two digit lines D, D* are equal, then coupling the digit lines to each other will equalize the voltages on the digit lines to DVC2 without the need to supply any power to the digit lines. However, if the dummy capacitor 172 is coupled only to the active digit line, coupling the two digit lines to each other will not cause the digit lines to equilibrate to DVC2. As a result, it would be necessary to drive the digit lines to DVC2 using the n-channel transistors of the equilibration circuit 124, thereby unnecessarily consuming power.

Fluctuations in the DVC2 voltage are preferably eliminated or substantially reduced by balancing the digit lines D, D* before the digit lines are equilibrated. If the digit lines D and D* have capacitances that are out of balance and the data storage capacitors 162, as a group, store more 0's than 1's, then the DVC2 voltage will decline during equilibration. More specifically, after the sense amplifier drives the digit lines D, D* to VCC and ground, the Dummy Row line or Dummy Row* line, that is coupled to the access transistor 170 for the reference digit line, is activated to thereby couple the corresponding dummy capacitor 172 to the reference digit line. This dummy capacitor is then charged to VCC or discharged to ground by the sense amplifier. At this point, the capacitances of the digit lines D, D* are balanced since the active digit line is also coupled to a dummy capacitor. Therefore, when the digit lines D, D* are coupled to each other during equilibration, they are equilibrated to DVC2 without the need to supply significant power to the digit lines D, D*. The Dummy Row line and Dummy Row* are then inactivated to decouple the dummy capacitors 172 from the digit lines D, D*, and, before the next memory cell is read, one of the dummy capacitors 172 is coupled to the active digit line.

Whereas, one dummy capacitor 172 is coupled to each of the digit lines D and D* during equilibration, one of these dummy capacitors 172 is decoupled from a respective digit line before the next read cycle. The digit line that is to become the active digit line during a subsequent read access cycle preferably remains coupled to its corresponding dummy capacitor during equilibration through to and including the subsequent read access. If however, the digit line is momentarily decoupled after equilibration, it is recoupled before the following read cycle. The digit line that is to become the reference digit line is coupled to its corresponding dummy capacitor 172 prior to and during equilibration. Therefore, during equilibration and possibly prior to and during equilibration, the active and reference digit lines are both simultaneously coupled to their corresponding dummy capacitors 172. When equilibration ends, the dummy capacitor 172 that is then coupled to the reference digit line, is decoupled from the reference digit line leaving one dummy capacitor 172 coupled to the active digit line. The dummy capacitors 172 are found in extra rows called dummy rows.

The dummy capacitor might be composed of plural capacitors (to increase capacitance) from plural extra (or dummy) rows. For example, if four extra rows are provided, two rows are assigned as an active dummy row and two rows are assigned as a reference dummy row. When the dummy capacitors 172 are coupled to the active digit line, the dummy capacitors in both rows are coupled. This tends to increase the capacitance. Alternatively, the capacitance of each dummy capacitor 172 in a dummy row might be made larger than a capacitance of data storage capacitors 162 in an addressed row that stores data. Similar structures are provided in the active and reference dummy rows.

In effect, a capacitance on an active digit line D is increased relative to a capacitance on a reference digit line D* by any means. Or viewed alternatively, a capacitance on a reference digit line D is decreased relative to a capacitance on an active digit line D* by any means. Then, the active digit line D is coupled to a memory cell. The voltage on the active digit line D is next compared to a voltage on the reference digit line D* to sense a voltage differential. The active and reference digit lines are driven to increase the voltage differential until the voltage on the active digit line and the voltage on the reference digit line reach respect first and second predetermined voltages (e.g., VCC and ground).

The voltage on Dummy Row and Dummy Row* lines used to couple a dummy capacitor to the digit lines need not be as high as the voltage coupling a data storage capacitor to a digit line during a read operation. However, during equilibration, the voltage on Dummy Row and Dummy Row* is advantageously set to VCCP. In this way, before equilibration one dummy capacitor 172 is charged to VCC volts and another dummy capacitor 172 is charged to ground so that during equilibration, the digit lines D, D* are equilibrated to VCC/2 which is the voltage provided by a DVC2 voltage generator. If prior to equilibration, Dummy Row and Dummy Row* were set to less than VCC, then the digit lines D, D* would become equilibrated to a voltage less than DVC2. This may better balance the 0's margin with the 1's margin to facilitate extending the refresh time intervals, but the sense amplifier would operate slower under the lower voltage after equilibration.

On the other hand, during a read operation, the voltages on Dummy Row and Dummy Row* need only be greater than DVC2 plus the transistor threshold voltage VT of the dummy access transistor 170 since the dummy access transistors will be charged to the equilibration voltage DVC2 during equilibration. If the charge on data storage capacitor 162 raises the voltage on the active digit line significantly during a read access, the 1's margin is good, and there is little need for the active dummy capacitor to slow the discharge of the active digit line. On the other hand, if the charge on data storage capacitor 162 is very near to a loss of data condition (i.e., declines to be close to DVC2), the voltage on the active digit line during the read operation will be close to DVC2 and the n-channel transistors of the N sense amplifier will quickly pull down the voltage on the active digit line toward NLAT until the active dummy capacitor "kicks in" after the voltage on the active digit line declines to less than DVC2.

By driving the Dummy Row and Dummy Row* lines over a voltage range defined between ground and a voltage that is less than the full voltage that can be stored on data storage capacitor 162 (e.g., VCC), significant power can be saved. For example, if the data storage voltage varies between a VCC of 5 volts and ground (thus DVC2 is 2.5 volts) and if VT is 0.3 volts, the voltages applied to Dummy Row and Dummy Row* lines need only vary from ground to about 3 volts instead of the full range of ground to 5 volts. Since power consumed driving the Dummy Row and Dummy Row* lines is given by $CV^2f$ where V is the voltage range, then one can expect to save 64% of the power that would otherwise be required to drive the Dummy Row and Dummy Row* lines if they had to be driven between ground and 5 volts.

In an alternative example, more power may also be saved by time managing the pulses applied to the Dummy Row and Dummy Row* lines. In one method, a predetermined time after the n-channel transistors of the N sense amplifier are activated during a read operation (e.g., NLAT is coupled to ground), the voltage on the gate electrode of the active dummy access transistor 170 (i.e., the voltage applied either Dummy Row or Dummy Row*) is returned to ground or some other voltage that will turn off the active dummy access transistor or decouple the active dummy capacitor from the active digit line. Note that the voltage on the gate electrode of the reference dummy access transistor 170 had already been returned to ground before NLAT was coupled to ground. The predetermined time is a sufficient time after the imbalance in the digit lines is fully sensed to ensure an accurate data read cycle but shortly after that so as to limit power consumption in the active dummy row.

For example, during a read operation, both digit lines are pulled toward NLAT (and NLAT is typically coupled to ground). However, the reference digit line pulls down faster than the active digit line since the active digit line has greater capacitance because the active digit line is coupled to a dummy capacitor at this time. The voltage imbalance between the digit lines is thereby increased. After the predetermined time, the voltage imbalance has increased sufficiently that a risk of misreading the data storage capacitor 162 has passed. At this time, the voltage applied to the gate electrode of the active dummy access transistor 170 is returned to ground. This has the effect of decreasing the capacitance on the active digit line since the active digit line is decoupled from the dummy capacitor at this time.

It is preferred that the active dummy capacitor 172 be decoupled from the active digit line before the p-channel transistors of the P sense amplifier are activated by, for example, coupling PSENSE to VCC. The power consumed by circuits driving or changing voltages on the active digit line is CV2f where C is the capacitance associated with the active digit line. By decoupling the active dummy capacitor from the active digit line before the P sense amplifier is activated, the p-channel transistor that sources current to the active digit line will be able charge the digit line to VCC with less charge passing through the transistor since the capacitance associated with the active digit line has been reduced. This reduces power consumption.

Thus, during equilibration within a memory array (100, 200 of FIG. 2), an active digit line D is coupled to an active dummy capacitor 172, and at a same time, a reference digit line D* is coupled to a reference dummy capacitor 172. Known memory arrays do not include what is referred to here as a dummy capacitor and do not couple one storage capacitor to an active digit line at the same time as another storage capacitor is coupled to a reference digit line. To the known art, coupling extra capacitance to the digit lines is viewed as increasing power consumption since it would be necessary to charge and subsequently discharge a greater capacitance. In known memory arrays, equilibration is performed between the minimum capacitances characterizing the digit lines alone.

Furthermore, during a read operation within a memory array (100, 200 of FIG. 2), an active digit line is coupled at a same time both to a dummy capacitor 172 and to an active addressed capacitor 162 of an addressed row of data storage capacitors. Known memory arrays do not add capacitance load to the active digit line (and not the reference digit line) during are read cycle when an addressed (i.e., data) storage capacitor 162 is coupled to the active digit line.

Figure 1:
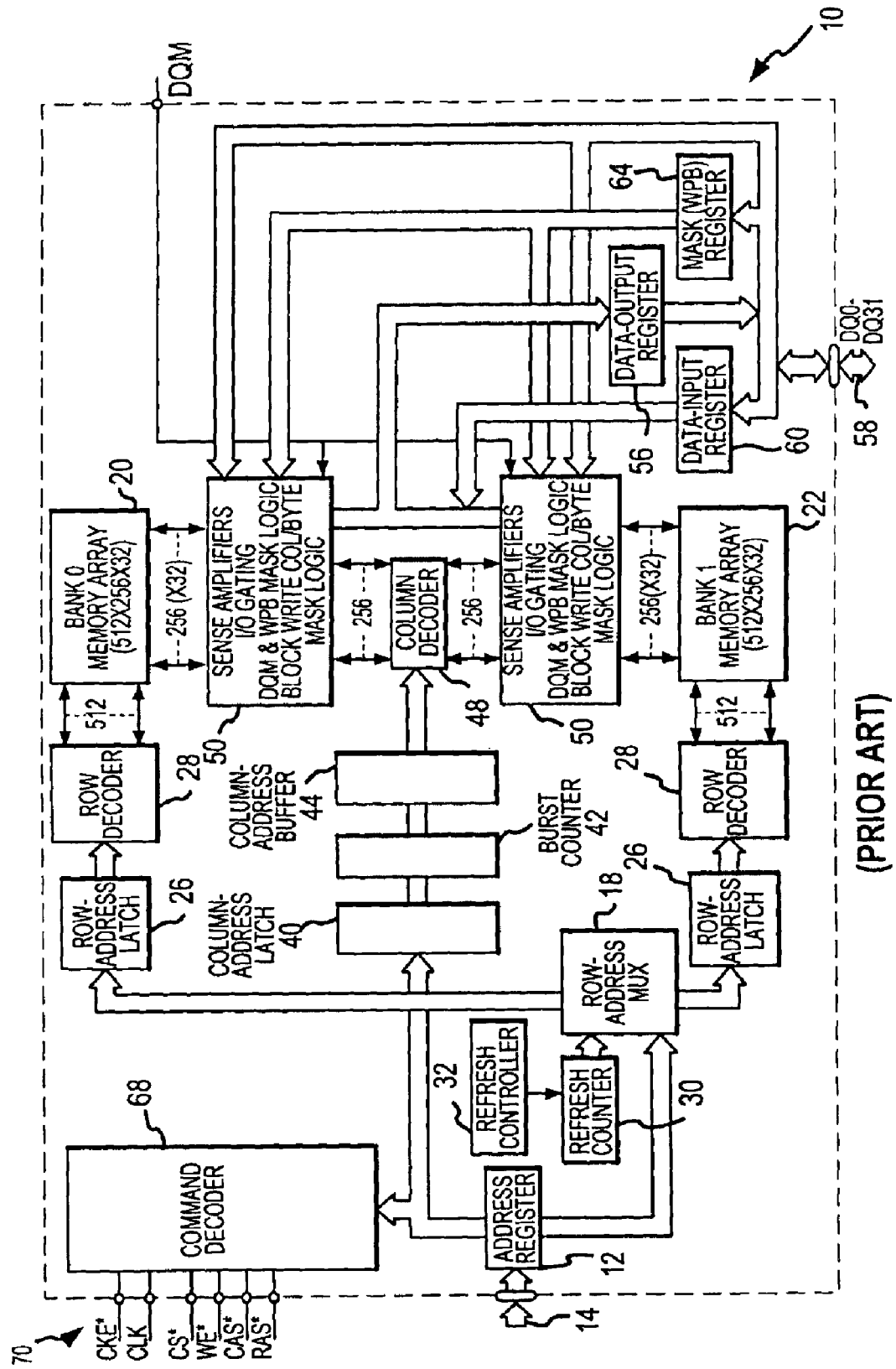
FIG. 1 is a block diagram of a known SDRAM.

In a memory device (10 of FIG. 1), control circuitry (e.g., 28, 48, 68 of FIG. 1) includes logic to increase a capacitance on the active digit line D relative to a capacitance on the reference digit line D* in a memory array (100, 102 of FIG. 2) before the negative sense amplifier is activated. The control circuitry is typically implemented out of known CMOS logic elements configured in light of these teachings; however, other circuitry types might be used. For example, programmable gate arrays, microprogram driven control circuits, programmable logic arrays or some form of application specific integrated circuits (ASIC) might be employed. The control circuitry is operable to maintain a dummy capacitor coupled to the active digit line after equilibration. The control circuitry is further operable to maintain another dummy capacitor decoupled from the reference digit line after equilibration. Furthermore, the control circuitry further operates to enable the negative sense amplifier 120 before the positive sense amplifier 122 is enabled (see FIG. 2). For example, the control circuitry causes signal NLAT to be coupled to ground a predetermined time before signal PSENSE is coupled to VCC.

A computer system includes a processor (e.g., a microprocessor, a DSP, a desktop computer, a minicomputer, an application specific integrated circuit or ASIC, a programmable gate array or PLA or the line, etc.) coupled to the memory device (10 of FIG. 1) as discussed above. The memory device might be incorporated in a memory system that operates cooperatively with the processor. As will be appreciated in light of the above description, the computer system incorporating the memory device discussed above will consume less power, and a portable computer system will have the advantage of being able to operate for longer intervals on battery power before requiring a recharge.

Having described preferred embodiments of a novel circuit and method for decreasing the required refresh rate for DRAM devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A method of reading from a memory cell comprising:
   coupling an active digit line to an active dummy capacitor while coupling a reference digit line to a reference dummy capacitor;
   equilibrating the active digit line and the reference digit line to an equilibration potential;
   decoupling the reference digit line from the reference dummy capacitor;
   coupling the active digit line to an active addressed capacitor;
   sensing a voltage differential between the active and reference digit lines; and
   driving the active and reference digit lines to increase the voltage differential.

2. The method of claim 1, wherein the act of driving the active and reference digit lines to increase the voltage differential comprising driving the active and reference digit lines with a negative sense amplifier and a positive sense amplifier, the active and reference digit lines being driven with the negative sense amplifier before being driven with the positive sense amplifier.

3. The method of claim 1, wherein the act of driving the active and reference digit lines to increase the voltage differential comprises driving the active and reference digit lines to increase the voltage differential until the voltage on the active digit line and the voltage on the reference digit line reach respect first and second predetermined voltages.

4. A method of reading from a memory cell comprising:
   increasing a capacitance on an active digit line relative to a capacitance on a reference digit line;
   coupling a memory cell to the active digit line; and
   comparing a voltage on the active digit line to a voltage on the reference digit line to sense a voltage differential; and
   driving the active and reference digit lines to increase the voltage differential.

5. The method of claim 4, further comprising coupling the active digit line through an active dummy access transistor to an active dummy capacitor and coupling the reference digit line through a reference dummy access transistor to a reference dummy capacitor, wherein:
   the coupling of a memory cell to the active digit line includes applying a first predetermined voltage to a gate electrode of an addressed access transistor that is coupled between an addressed storage capacitor of the memory cell and the active digit line;
   the increasing of a capacitance on an active digit line relative to a capacitance on a reference digit line includes applying a second predetermined voltage to a gate electrode of the active dummy access transistor sufficient to couple the active digit line to the active dummy capacitor; and
   the first predetermined voltage is greater than the second predetermined voltage.

6. The method of claim 5, wherein:
   the comparing of a voltage on the active digit line to a voltage on the reference digit line includes activating n-channel transistors in a sense amplifier;
   the increasing of a capacitance on an active digit line relative to a capacitance on a reference digit line further includes applying a third predetermined voltage to the gate electrode of the active dummy access transistor a predetermined time after the n-channel transistors are activated; and
   the third predetermined voltage is sufficient to decouple the active digit line from the active dummy capacitor.

7. The method of claim 6, wherein:
   the increasing of a capacitance on an active digit line relative to a capacitance on a reference digit line further includes applying the second predetermined voltage to a gate electrode of another active dummy access transistor sufficiently before equilibration in a subsequent access cycle that another active dummy capacitor is charged to a voltage of another active digit line before the equilibration.

8. The method of claim 4, further comprising coupling the active digit line through an active dummy access transistor to an active dummy capacitor and coupling the reference digit line through a reference dummy access transistor to a reference dummy capacitor, wherein
   the coupling of a memory cell to the active digit line includes applying a first predetermined voltage to a gate electrode of an addressed access transistor that is coupled between an addressed storage capacitor of the memory cell and the active digit line;
   the increasing of a capacitance on an active digit line relative to a capacitance on a reference digit line includes applying a second predetermined voltage to a gate electrode of the reference dummy access transistor sufficient to decouple the reference digit line from a reference dummy capacitor and applying a third predetermined voltage to a gate electrode of the active dummy access transistor sufficient to couple the active digit line to the active dummy capacitor; and
   the first predetermined voltage is greater than or equal to the third predetermined voltage.

9. The method of claim 8, wherein the comparing of a voltage on the active digit line to a voltage on the reference digit line includes:
   activating n-channel transistors in a sense amplifier after applying the second predetermined voltage to the gate electrode of the reference dummy access transistor.

10. The method of claim 8, wherein:
    the comparing of a voltage on the active digit line to a voltage on the reference digit line includes activating n-channel transistors in a sense amplifier; and
    the increasing of a capacitance on an active digit line relative to a capacitance on a reference digit line further includes applying the second predetermined voltage to the gate electrode of the active dummy access transistor a predetermined time after the n-channel transistors are activated.

11. The method of claim 4, wherein the comparing of a voltage on the active digit line to a voltage on the reference digit line includes:
    activating n-channel transistors in a sense amplifier; and
    activating p-channel transistors in the sense amplifier a predetermined time after the n-channel transistors are activated.

12. The method of claim 4, further comprising driving the active and reference digit lines to increase the voltage differential until the voltage on the active digit line and the voltage on the reference digit line reach respect first and second predetermined voltages.

13. A method of reading from a memory cell comprising:
    decreasing a capacitance on a reference digit line relative to a capacitance on an active digit line;

coupling a memory cell to the active digit line;
comparing a voltage on the active digit line to a voltage on the reference digit line to sense a voltage differential; and
driving the active and reference digit lines to increase the voltage differential.

14. The method of claim 13, further comprising coupling the active digit line through an active dummy access transistor to an active dummy capacitor and coupling the reference digit line through a reference dummy access transistor to a reference dummy capacitor, wherein
the coupling of a memory cell to the active digit line includes applying a first predetermined voltage to a gate electrode of an addressed access transistor that is coupled between an addressed storage capacitor of the memory cell and the active digit line;
the decreasing of a capacitance on a reference digit line relative to a capacitance on an active digit line includes applying a second predetermined voltage to a gate electrode of the reference dummy access transistor sufficient to decouple the reference digit line from a reference dummy capacitor while a third predetermined voltage is applied to a gate electrode of the active dummy access transistor sufficient to couple the active digit line to the active dummy capacitor; and
the first predetermined voltage is greater than or equal to the third predetermined voltage.

15. The method of claim 14, wherein:
the comparing of a voltage on the active digit line to a voltage on the reference digit line includes activating n-channel transistors in a sense amplifier; and
the decreasing of a capacitance on a reference digit line relative to a capacitance on an active digit line further includes applying the second predetermined voltage to the gate electrode of the active dummy access transistor a predetermined time after the n-channel transistors are activated.

16. The method of claim 13, wherein the comparing of a voltage on the active digit line to a voltage on the reference digit line includes:
activating n-channel transistors in a sense amplifier; and
activating p-channel transistors in the sense amplifier a predetermined time after the n-channel transistors are activated.

17. The method of claim 13, further comprising driving the active and reference digit lines to increase the voltage differential until the voltage on the active digit line and the voltage on the reference digit line reach respect first and second predetermined voltages.

18. A memory device comprising:
a main sub-array that includes a plurality of main rows, each main row including a plurality of memory cells, each memory cell of each main row corresponding to a respective digit line of a plurality of digit lines;
a first dummy sub-array that includes a plurality of memory cells, each memory cell corresponding to a respective digit line of the plurality of digit lines, one memory cell of the plurality of memory cells including an active dummy capacitor coupled to an active digit line of the plurality of digit lines;
a negative sense amplifier coupled to the active digit line and to a reference digit line of the plurality of digit lines; and
control circuitry operable to enable the negative sense amplifier to a predetermined time before decoupling the active digit line from the active dummy capacitor.

19. A computer system comprising a processor coupled to a memory device, wherein the memory device includes:
a main sub-array that includes a plurality of main rows, each main row including a plurality of memory cells, each memory cell of each main row corresponding to a respective digit line of a plurality of digit lines;
a negative sense amplifier;
a first dummy sub-array that includes a plurality of memory cells, each memory cell corresponding to a respective digit line of a plurality of digit lines;
a second dummy sub-array that includes a plurality of memory cells, each memory cell corresponding to a respective digit line of a plurality of digit lines; and
control circuitry operable to increase a capacitance on an active digit line of the plurality of digit lines relative to a capacitance on a reference digit line of the plurality of digit lines before the negative sense amplifier is activated.

20. A memory array comprising:
a first dummy sub-array that includes a plurality of capacitors, each capacitor corresponding to a respective one of a plurality of digit lines; and
a second dummy sub-array that includes a plurality of capacitors, each capacitor corresponding to a respective one of the plurality of digit lines, an active digit line of the plurality of digit lines being coupled to an equilibration voltage and to a dummy capacitor of the plurality of capacitors of the first dummy sub-array, a reference digit line of the plurality of digit lines being coupled to the equilibration voltage and to a reference dummy capacitor of the plurality of capacitors of the second dummy sub-array.

21. The memory array of claim 20, wherein:
the first dummy sub-array further includes a plurality of access transistors, each access transistor corresponding to a respective one of the plurality of digit lines;
the second dummy sub-array further includes a plurality of access transistors, each access transistor corresponding to a respective one of the plurality of digit lines;
an active dummy access transistor of the first dummy sub-array is coupled in an on state between the active digit line and the dummy capacitor of the plurality of capacitors of the first dummy sub-array; and
a reference dummy access transistor of the second dummy sub-array is coupled in an on state between the reference digit line and the dummy capacitor of the plurality of capacitors of the second dummy sub-array.

22. The memory array of claim 20, further comprising a main sub-array, wherein:
the main sub-array includes a plurality of main rows;
each main row includes a plurality of capacitors and a plurality of access transistors;
each capacitor of each main row corresponds to a respective digit line of the plurality of digit lines; and
an addressable access transistor of the plurality of access transistors is coupled in an off state between the active digit line and one of the plurality of capacitors in an addressed main row of the main sub-array.

23. The memory array of claim 20, further comprising third and fourth dummy sub-arrays, wherein:
the third dummy sub-array includes a plurality of capacitors, each capacitor corresponding to a respective digit line of the plurality of digit lines;
the fourth dummy sub-array includes a plurality of capacitors, each capacitor corresponding to a respective digit line of the plurality of digit lines;

the active digit line is further coupled to a dummy capacitor of the plurality of capacitors of the third dummy sub-array; and the reference digit line is further coupled to a reference dummy capacitor of the plurality of capacitors of the fourth dummy sub-array.

24. A memory array comprising:

a main sub-array that includes a plurality of main rows, each main row including a plurality of capacitors, each capacitor of each main row corresponding to a respective digit line of a plurality of digit lines;

a first dummy sub-array that includes a plurality of capacitors, each capacitor corresponding to a respective digit line of a plurality of digit lines, an active digit line of the plurality of digit lines being coupled both to a dummy capacitor of the plurality of capacitors of the first dummy sub-array and to an active addressed capacitor of the plurality of capacitors of an addressed row of the plurality of main rows; and a second dummy sub-array including a plurality of capacitors, each capacitor corresponding to a respective digit line of a plurality of digit lines, the plurality of capacitors including a reference dummy capacitor, the plurality of digit lines including a reference digit line decoupled from the reference dummy capacitor.

25. The memory array of claim 24, wherein:

the active digit line is coupled to the dummy capacitor through a dummy access transistor;

the active digit line is coupled to the active addressed capacitor through an addressed access transistor; and the dummy access transistor is characterized by a lower on resistance than an on resistance that characterizes the addressed access transistor.

26. The memory array of claim 24, wherein:

the active digit line is coupled to the dummy capacitor through a dummy access transistor;

the active digit line is coupled to the active addressed capacitor through an addressed access transistor; and the dummy access transistor is characterized by a lower threshold voltage than a threshold voltage that characterizes the addressed access transistor.

27. A memory device comprising a main sub-array, a negative sense amplifier and control circuitry, wherein:

the main sub-array includes a plurality of main rows, each main row including a plurality of memory cells, each memory cell of each main row corresponding to a respective digit line of a plurality of digit lines, one of the plurality of digit lines being an active digit line, another of the plurality of digit lines being a reference digit line; and the control circuitry is operable to increase a capacitance on the active digit line relative to a capacitance on the reference digit line before the negative sense amplifier is activated.

28. The memory device of claim 27, further comprising a first dummy sub-array, wherein:

the first dummy sub-array includes a plurality of memory cells, each memory cell corresponding to a respective digit line of the plurality of digit lines; and the control circuitry includes circuitry to maintain a capacitor in a memory cell of the first dummy sub-array coupled to the active digit line after equilibration.

29. The memory device of claim 28, further comprising a second dummy sub-array, wherein:

the second dummy sub-array includes a plurality of memory cells, each memory cell corresponding to a respective digit line of the plurality of digit lines; and the control circuitry includes circuitry to maintain a capacitor in a memory cell of the second dummy sub-array decoupled from the reference digit line after equilibration.

30. A memory device comprising:

a main sub-array that includes a plurality of main rows, each main row including a plurality of memory cells, each memory cell of each main row corresponding to a respective digit line of a plurality of digit lines;

a negative sense amplifier coupled to an active digit line of the plurality of digit lines and to a reference digit line of the plurality of digit lines;

a positive sense amplifier coupled to the active and reference digit lines; and control circuitry operable to enable the negative sense amplifier before the positive sense amplifier is enabled.

31. The memory device of claim 30, further comprising first and second dummy sub-arrays, wherein:

the first dummy sub-array includes a plurality of memory cells, each memory cell corresponding to a respective digit line of the plurality of digit lines; and the second dummy sub-array includes a plurality of memory cells, each memory cell corresponding to a respective digit line of the plurality of digit lines, the control circuitry being further operable to increase a capacitance on an active digit line of the plurality of digit lines relative to a capacitance on a reference digit line of the plurality of digit lines before the negative sense amplifier is activated.

32. A memory device comprising control circuitry, a main sub-array and a first dummy sub-array, wherein:

the main sub-array includes a plurality of main rows;

each main row includes a plurality of memory cells, each memory cell of each main row corresponding to a respective digit line of a plurality of digit lines, one of the plurality of memory cells of the plurality of main rows being an addressed memory cell, one of the plurality of digit lines being an active digit line, another of the plurality of digit lines being a reference digit line;

the first dummy sub-array includes a plurality of memory cells, each memory cell corresponding to a respective digit line of the plurality of digit lines, one of the plurality of memory cells of the first dummy sub-array including an active dummy access transistor; and the control circuitry is operable to apply a first predetermined voltage to a gate electrode of an addressed access transistor that is coupled between an addressed storage capacitor of the addressed memory cell and the active digit line while a second predetermined voltage is applied to a gate electrode of the active dummy access transistor sufficient to couple the active digit line to the active dummy capacitor, the first predetermined voltage being greater than the second predetermined voltage.

* * * * *